(12) United States Patent
Calvillo Cortes et al.

(10) Patent No.: US 9,048,020 B2
(45) Date of Patent: Jun. 2, 2015

(54) BOND WIRE TRANSFORMER

(75) Inventors: David Angel Calvillo Cortes, Delft (NL); Leo C. N. De Vreede, Pynacker (NL); Mark Pieter van der Heijden, 's-Hertogenbosch (NL)

(73) Assignee: NXP, B.V., Eindhoven (NL)

( * ) Notice: Subject to any disclaimer, the term of this patent is extended or adjusted under 35 U.S.C. 154(b) by 23 days.

(21) Appl. No.: 13/310,293

(22) Filed: Dec. 2, 2011

(65) Prior Publication Data
US 2012/0139640 A1    Jun. 7, 2012

(30) Foreign Application Priority Data

Dec. 3, 2010  (EP) ..................................... 10193629
Dec. 14, 2010 (EP) ..................................... 10194851

(51) Int. Cl.
| | |
|---|---|
| H01F 27/28 | (2006.01) |
| H01F 21/02 | (2006.01) |
| H01F 19/04 | (2006.01) |
| H03F 1/02 | (2006.01) |
| H03F 3/217 | (2006.01) |

(52) U.S. Cl.
CPC ............ *H01F 27/2823* (2013.01); *H01F 19/04* (2013.01); *H01F 27/2828* (2013.01); *H03F 1/0294* (2013.01); *H03F 3/2176* (2013.01); *H03F 2200/537* (2013.01); *H03F 2200/541* (2013.01); *H01L 2224/49175* (2013.01); *H01L 2924/3011* (2013.01); *H01L 2924/30107* (2013.01)

(58) Field of Classification Search
USPC ............ 336/145, 147, 182, 183, 170; 333/26, 333/100; 330/295
See application file for complete search history.

(56) References Cited

U.S. PATENT DOCUMENTS

| | | | |
|---|---|---|---|
| 6,586,309 B1 | 7/2003 | Yeo et al. | |
| 6,998,953 B2 | 2/2006 | Yeo et al. | |
| 7,091,791 B1 | 8/2006 | Terrovitis | |
| 7,453,142 B2 | 11/2008 | Lee et al. | |
| 7,714,649 B1 | 5/2010 | Cripe | |
| 8,174,322 B2 | 5/2012 | van der Heijden | |
| 8,203,386 B2 | 6/2012 | van der Heijden | |
| 2004/0075492 A1 | 4/2004 | Wight et al. | |
| 2004/0104456 A1 | 6/2004 | Duffy et al. | |
| 2005/0122198 A1* | 6/2005 | Zhou et al. | ............. 336/200 |
| 2005/0167828 A1* | 8/2005 | Yeo et al. | ............. 257/734 |

(Continued)

FOREIGN PATENT DOCUMENTS

| | | |
|---|---|---|
| EP | 0194133 A2 | 9/1986 |
| EP | 1202296 A1 | 5/2002 |
| WO | 20081123082 A1 | 10/2008 |

OTHER PUBLICATIONS

Niknejad, Electromagnetics for High-Speed Analog and Digital Communication Circuits, Cambridge University Press, 2007, Ch. 5.

(Continued)

*Primary Examiner* — Elvin G Enad
*Assistant Examiner* — Ronald Hinson (57) ABSTRACT

A bond wire transformer comprises a plurality of primary bond wires coupled in parallel; and a plurality of secondary bond wires coupled in parallel, each secondary bond wire being spaced apart from and oriented relative to a corresponding primary bond wire so as to achieve a desired mutual inductance between the corresponding primary and secondary bond wires, thereby providing magnetic coupling between the primary and secondary bond wires.

20 Claims, 6 Drawing Sheets

(56) References Cited

U.S. PATENT DOCUMENTS

| | | |
|---|---|---|
| 2007/0128821 A1* | 6/2007 | Lee et al. ............... 438/381 |
| 2008/0014436 A1* | 1/2008 | Nickerson et al. ............ 428/332 |
| 2011/0051842 A1 | 3/2011 | van der Heijden et al. |

OTHER PUBLICATIONS

Cho et al, "A High-Efficiency Transformer Using Bond Wires for Si RF IC", IEICE Trans. Electron., vol. E93-C, No. 1, Jan. 2010, pp. 140-141.

Extended European Search Report for Patent Application No. 10194851.1, European Patent Office, 2012.

Beltran, R. et al. "HF Outphasing Transmitter Using Class-E Power Amplifier", IEEE Microwave Symposium Digest, pp. 757-760 (Jun. 2009).

Gerhard, W. et al. "Differentially Coupled Outphasing WCDMA Transmitter with Inverse Class F Power Amplifiers", IEEE Radio and Wireless Symposium, pp. 355-358 (Jan. 2006).

Gerhard, W. et al. "Novel Transmission Line Combiner for Highly Efficient Outphasing RF Power Amplifiers", IEEE Proceedings of the $2^{nd}$ European Microwave Integrated Circuits Conf., pp. 635-638 (Oct. 2007).

Grundlingh, J. et al. "A High Efficiency Chireix Out-Phasing Power Amplifier for 5GHz WLAN Applications", IEEE Microwave Symposium Digest, vol. 3, pp. 1535-1538 (Jun. 2004).

Hakala, I. et al. "A 2.14-GHz Chireix Outphasing Transmitter", IEEE Trans. on Microwave Theory and Tech., vol. 53, No. 6, pp. 2129-2138 (Jun. 2005).

Hung, T.-P. et al. "CMOS Outphasing Class-D Amplifier with Chireix Combiner", IEEE Microwave and Wireless Components Letters, vol. 17, No. 8, pp. 619-621 (Aug. 2007).

Huttunen, A. et al. "A 20-W Chireix Outphasing Trasmitter for WCDMA Base Stations", IEEE Transactions on Microwave Theory and Techniques, vol. 55, No. 12, pp. 2709-2718 (Dec. 2007).

Lu, J. et al. "On-Chip Bondwire Transformers for Power SOC Applications", IEEE Applied Power Electronics Conf. and Exposition, pp. 199-204 (Feb. 2008).

Lee, H. et al. "A CMOS Power Amplifier for Multi-Mode LINC Architecture", IEEE Radio and Wireless Symposium, pp. 41-44 (Jan. 2010).

Moloudi, S. et al. "An Outphasing Power Amplifier for a Software-Defined Radio Transmitter", IEEE Solid-State Circuits Conf., Digest of Tech. papers, 3 pgs. (Feb. 2008).

Qureshi, J. et al. "A Highly Efficient Chireix Amplifier Using Adaptive Power Combining", IEEE Microwave Symposium Digest, pp. 759-762 (Jun. 2008).

Qureshi, J. H. et al. "A 90-W Peak Power GaN Outphasing Amplifier with Optimum Input Signal Conditioning", IEEE Transactions on Microwave Theory and Techniques, vol. 57, No. 8, pp. 1925-1935 (Aug. 2009).

van Schie, M.C.A. et al. "Analysis and Design of a Wideband High Efficiency CMOS Outphasing Amplifier", IEEE Radio Frequency Integrated Circuits Symposium, 4 pgs. (May 2010).

Song, B.-W. et al. "Vertical Integrated Transformer Using Bondwires for MMIC's", IEEE Microwave Symposium Digest, vol. 3, pp. 1341-1344 (Jun. 2000).

Zhou, Y. et al. "A Distributed Active Transformer Coupled Outphasing Power Combiner", IEEE Asia Pacific Microwave Conf., pp. 2565-2568 (Dec. 2009).

Acar, M. et al. "Analytical Design Equations for Class-E Power Amplifiers", IEEE Transactions on Circuits and Systems—I: Regular Papers, vol. 54, No. 12, pp. 2706-2717 (Dec. 2007).

Chireix, H. "High Power Outphasing Modulation", IEEE Proceedings of the Institute of Radio Engineers, vol. 23, No. 11, pp. 1370-1392 (Nov. 1935).

Cox, D. "Linear Amplification with Nonlinear Components", IEEE Transactions on Communications, vol. 22, No. 12, pp. 1942-1945 (Dec. 1974).

Grebennikov, A. et al. "Class E with Parallel Circuit—A New Challenge for High-Efficiency RF and Microwave Power Amplifiers", IEEE Microwave Symposium Digest, vol. 3, pp. 1627-1630 (2002).

Ng, K. T. et al. "Substrate Effects in Monolithic RF Transformers on Silicon", IEEE Transactions on Microwave Theory and Tech., vol. 50, No. 1, pp. 377-383 (Jan. 2002).

"IPD Process Technology—High-Q Integrated Passive Device", ON Semiconductor, 2 pgs. retrieved from the internet at: Dec. 1, 2011 http://www.onsemi.com/PowerSolutions/content.do?id=16699 (1999).

Raab, F. "Efficiency of Outphasing RF Power-Amplifier Systems", IEEE Transactions on Communications, vol. COM-33, No. 10, pp. 1094-1099 (Oct. 1985).

Raab, F. H. et al. "Power Amplifiers and Transmitters for RF and Microwave", IEEE Transactions on Microwave Theory and Techniques, vol. 50, No. 3, pp. 814-825 (Mar. 2002).

Zulinski, R. et al. "Class E Power Amplifiers and Frequency Multipliers with Finite DC-Feed Inductance", IEEE Transactions on Circuits and Systems, vol. CAS-34, No. 9, pp. 1074-1087 (Sep. 1987).

\* cited by examiner

BOND WIRE TRANSFORMER

This application claims the priority under 35 U.S.C. §119 of European patent application no. 10193629.2, filed on Dec. 3, 2010, and patent application no. 10194851.1, filed on Dec. 14, 2010, the contents of which are incorporated by reference herein.

FIELD OF THE INVENTION

The invention relates to a transformer in which the primary and the secondary windings are made from bond wires.

BACKGROUND OF THE INVENTION

Many RF circuits and systems employ inductive components such as inductors and transformers. A few examples of these circuits are: voltage-controlled oscillators, low-noise amplifiers, matching networks, power combiners and power amplifiers.

Integrated inductors and transformers are known to have low quality (given by figures of merit such as the quality factor or Q, and the self-resonance frequency) due to semiconductor process limitations. Still, the limited quality of integrated passives can be tolerated in low-power applications. In high-power applications (for example, a base station), the use of such integrated passives is very rarely employed in the high-power circuitry due to their inefficiency.

Another approach to design inductors and transformers is by using standard bond wire fabrication techniques, the same techniques used for interconnections and package leads. Bond wire inductors and transformers avoid many of the technological limitations of standard integrated planar technologies. For example, they have reduced resistive and substrate losses (and thus, increased quality factors), reduced capacitive parasitics (and hence increased self-resonance frequencies), and can handle substantially higher currents.

One of the major challenges and concerns for the use of inductive components fabricated from bond wires is the relatively low predictability of their specific values, due to magnetic interactions with the surrounding media and manufacturing shape variations. Experimentation can lead to a bond wire shape that yields the expected performance and this shape can be easily replicated, and the use of automatic wire bonding machines with loop control capability can control the manufacturing yield and tolerance of a designed bond wire shape.

A common problem with state-of-the-art bond wire transformers is the complexity of arranging the many series connections required to fabricate the primary and secondary. The series connections are required to achieve the desired turns ratio, each loop of bond wire representing a turn. It can be inefficient in terms of space to provide sufficient bond pads for each series connection, and making each of the connections can be costly. Additionally, such series connection of the loops will increase the resistive losses of the structures, leading to lower power efficiency.

SUMMARY OF THE INVENTION

In accordance with a first aspect of the invention, there is provided a bond wire transformer comprising a plurality of primary bond wires coupled in parallel; and a plurality of secondary bond wires coupled in parallel, each secondary bond wire being spaced apart from and oriented relative to a corresponding primary bond wire so as to achieve a desired mutual inductance between the corresponding primary and secondary bond wires, thereby providing magnetic coupling between the primary and secondary bond wires.

The invention exploits the fact that the coupling factor and transformer ratio, whilst being influenced by the number of turns or "loops" of the transformer windings, are defined ultimately by general geometrical properties such as the separation between the windings and their cross-sectional areas. This means that a good transformer does not necessarily require multi-loop windings; in fact, a single loop (or half-loop) can provide good magnetic coupling.

Preferably, the number of primary bond wires is the same as the number of secondary bond wires. Alternatively, the number of primary bond wires may be approximately the same as the number of secondary bond wires, for example one fewer or one more.

Typically, each of the primary bond wires is connected between first and second common bonding pads.

Alternatively, the primary bond wires may be connected to nodes of a circuit such that the signals flowing in each of the primary bond wires are substantially the same.

Thus, the primary bond wires are electrically connected in parallel either by a direct physical connection or by a "virtual" connection in which equivalent signals flow in each bond wire (that is the same current is caused to flow in each wire simultaneously).

Similarly, each of the secondary bond wires may be connected between first and second common bonding pads to form a first section of the secondary bond wire.

The resulting bond wire transformer may further comprise a third common bonding pad, each of the secondary bond wires extending from the second common bonding pad to the third common bonding pad to form a second section of the secondary bond wire, whereby each of the first and second sections contribute to achieving the desired mutual inductance between the corresponding primary and secondary bond wires.

Thus, whilst it is envisaged that each primary bond wire will preferably have only a single loop or turn, each secondary bond wire may comprise multiple loops or turns. Multiple loops or turns (formed still with paralleled bond wires) at the secondary will enhance the properties of the transformer due to an increase of the transformer turns ratio, which is beneficial from a bandwidth point of view for impedance transformation and other relevant applications.

The secondary bond wires may be connected to nodes of a circuit such that the signals flowing in each of the secondary bond wires are substantially the same.

In accordance with a second aspect of the invention, there is provided an outphasing amplifier system comprising first and second power amplifiers and first and second bond wire transformers according to the first aspect of the invention, each of the first and second bond wire transformers being connected to a respective one of the first and second power amplifiers such that together the first and second bond wire transformers combine the power generated by the first and second power amplifiers.

In this outphasing amplifier, the secondary bond wires of the first and second bond wire transformers may be coupled together by a track that is adapted to have a desired capacitance to ground for use as a compensating element (for example, so-called Chireix compensation) in the outphasing amplifier system.

In one embodiment, the first bond wire transformer has a magnetising inductance equal to the parallel combination of a dc-feed inductance coupling a power supply to the first and/or second power amplifier and a compensating inductance. This results in a different bond wire shapes in the first and second transformer because the magnetising inductance of the bond wires depends on the number of parallel bond wires and their specific shape.

In another embodiment, the first and second bond wire transformers are identical and have their primary bond wires coupled in parallel, the primary bond wires of each bond wire transformer having a magnetising inductance equal to twice the DC-feed inductance required by each of the power amplifiers, the secondary bond wires of each bond wire transformer being coupled to a respective one of the first and second power amplifiers, and the outphasing system further comprises a compensating inductor coupling a power supply to the first power amplifier and having a value equal to the parallel combination of the DC-feed inductance required by the first power amplifier and an outphasing compensating inductance.

In accordance with a third aspect of the invention, there is provided a balun comprising a bond wire transformer according to the first aspect of the invention, wherein the primary bond wires extend from a positive terminal to a common centre tap terminal and from the centre tap terminal to a negative terminal, and the secondary bond wires extend between common first and second terminals.

In accordance with a fourth aspect of the invention, there is provided a power combiner comprising first and second bond wire transformers according to the first aspect of the invention, wherein each of the primary bond wires of the first transformer is connected between first and second bonding bars; each of the primary bond wires of the second transformer is connected between a third bonding bar and the second bonding bar; each of the secondary bond wires of the first transformer is connected between fourth and fifth bonding bars; and each of the secondary bond wires of the second transformer is connected between a sixth bonding bar and the fifth bonding bar.

The primary and/or secondary bond wires of the first transformer (10a) and second transformer (11a) may be connected to nodes of a circuit such that the signals flowing in each of the primary and/or secondary bond wires are substantially the same.

In accordance with a fifth aspect of the invention, there is provided a power amplifier system, such as the outphasing amplifier system according to the second aspect of the invention, comprising first and second transformers arranged to form a power combiner according to the fourth aspect of the invention.

Thus, in the outphasing amplifier system according to the second aspect of the invention, the first and second transformers may be arranged to form a power combiner according to the fourth aspect of the invention.

BRIEF DESCRIPTION OF THE DRAWINGS

Examples of the invention will now be described in detail with reference to the accompanying drawings, in which.

DETAILED DESCRIPTION OF EMBODIMENTS

Figure 1:
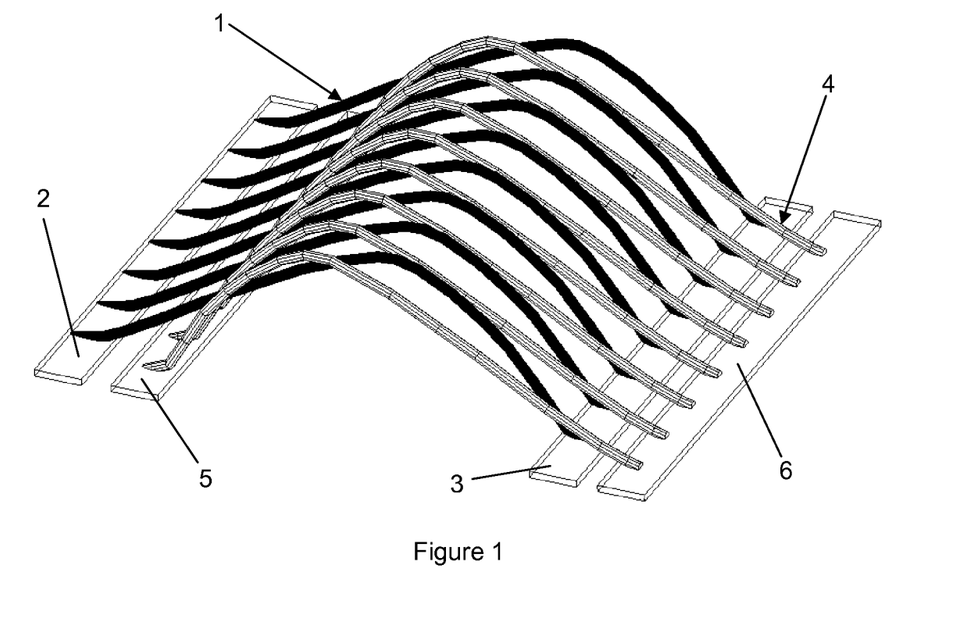
FIG. 1 shows a perspective view of one possible implementation of a bond wire transformer according to the invention.

FIG. 1 shows a perspective view of a transformer fabricated from bond wires. A first set of primary bond wires 1 is connected in parallel between metal bonding bars 2 and 3. Similarly, a second set of secondary bond wires 4 is connected in parallel between metal bonding bars 5 and 6. The primary 1 and secondary 4 bond wires interdigitate as they span the gaps between their respective bonding bars. Thus, each individual pair of adjacent primary and secondary bond wires form a transformer due to the magnetic coupling between them. However, since the bond wires 1 and 4 are electrically connected in parallel through the bonding bars 2, 3, 5 and 6, the transformer effect of each pair of bond wires is combined. It should be understood that the use of metal bonding bars 2, 3, 5 and 6 is just one possible way to create the parallel connection of the primary 1 and secondary 4 bond wires. There are other possibilities such as, but not limited to, bonding pads on transistor and capacitor dies, PCB metal traces, and the like.

Figure 2A:
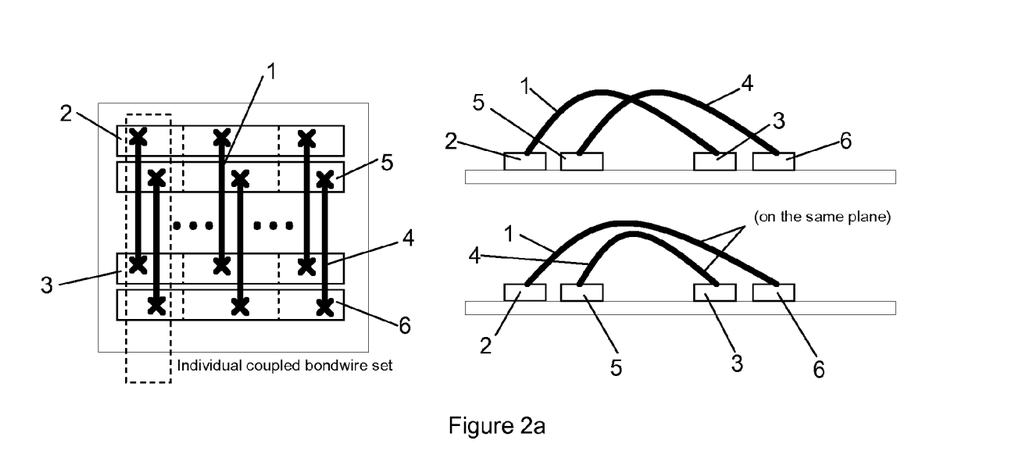
FIGS. 2a, 2b and 2c show, schematically, plan and side views of possible implementations of bond wire transformers according to the invention (including that of FIG. 1)

FIG. 2a shows schematically a plan view and side view of the arrangement of FIG. 1. Also shown is a second side view where, instead of the bond wires 1 and 4 interdigitating as in FIG. 1, the primary bond wires 1 span over the secondary bond wires 4. As can be seen from the second side view, bond wires 1 can lie in the same plane as bond wires 4, leading to a smaller pitch and hence increased magnetic coupling factor.

Figure 2B:
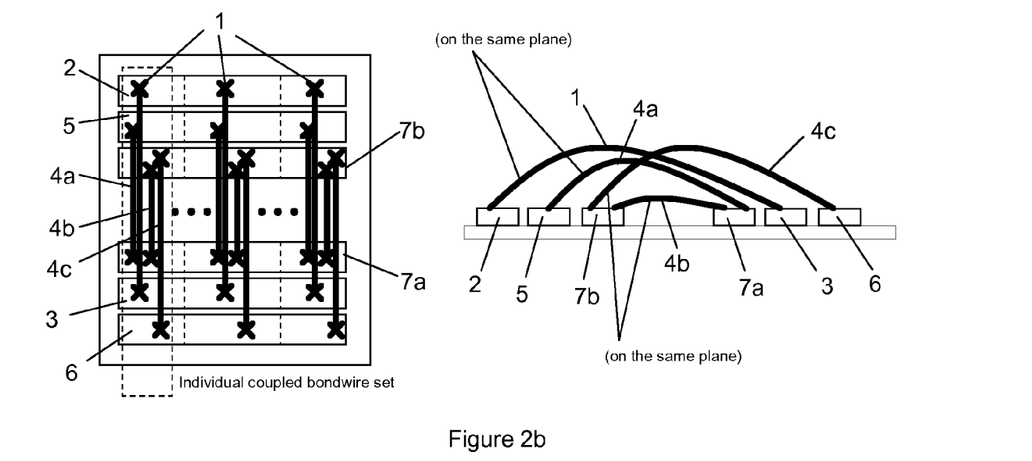

FIG. 2b shows a variant of this scheme in which the secondary bond wires are made up of several sections connected in series. The primary bond wires 1 still extend between bonding bars 2 and 3. However, the secondary bond wires comprise a first section 4a extending from bonding bar 5 to bonding bar 7a; a second section 4b extending from bonding bar 7a to bonding bar 7b; and a third section 4c extending from bonding bar 7b to bonding bar 6. As can be seen from the side view, bond wire 1 can lie in the same plane as bond wire section 4a and bond wire section 4b can lie in the same plane as bond wire section 4c. The bond wire sections 4a, 4b and 4c are designed to maximize the cross-sectional area of the secondary bond wires in order to enhance the magnetic flux and hence provide better magnetic coupling.

Figure 2C:
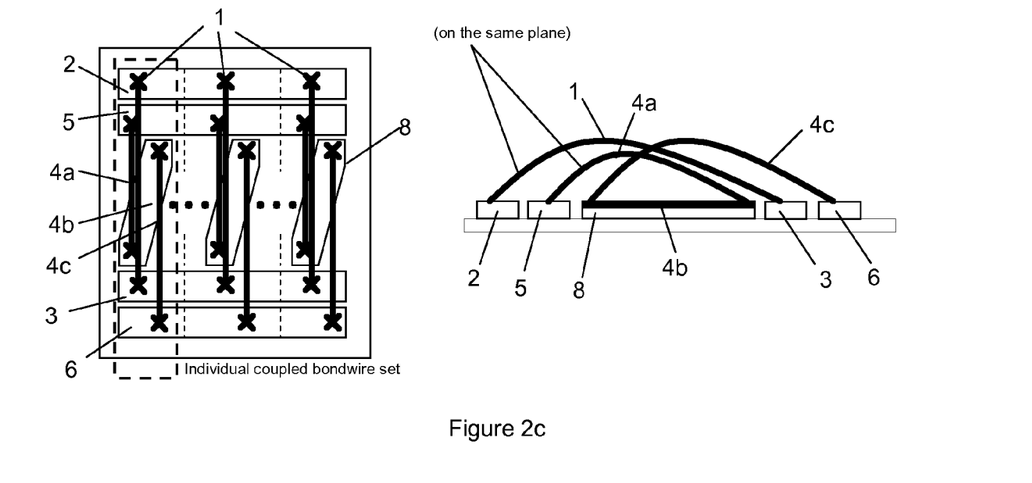

FIG. 2c shows another variant, similar to the one of FIG. 2b, in which the parallel secondary loops are made up of several bond wire sections and conductive traces on a substrate connected in series. The primary bond wires 1 still extend between bonding bars 2 and 3. However, the secondary bond loops comprise a first bond wire section 4a extending from bonding bar 5 to one edge of conductive trace 4b; a second section is the conductive trace 4b which is on top of substrate 8; and a third section is the bond wire 4c extending from another edge of conductive trace 4b to bonding bar 6. As can be seen from the side view, bond wire 1 can lie in the same plane as bond wire section 4a. The secondary winding sections 4a, 4b and 4c are designed to maximize the cross-sectional area of the secondary loop in order to enhance the magnetic flux and hence provide better magnetic coupling.

Also, the conductive traces 4b can all be separated as in FIG. 2c, or joined together in a single conductive plate.

Figure 3A:
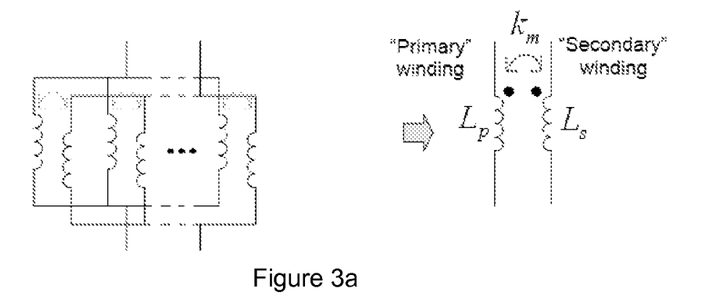
FIGS. 3a and 3b show effective equivalent circuits for the bond wire transformers according to the invention.

In FIGS. 1, 2a, 2b and 2c the primary and secondary bond wires 1 and 4 (including the conductive trace 4b of FIG. 2c) are connected electrically in parallel by direct connection through the metal bonding bars 2, 3, 5, 6, 7a and 7b. This is illustrated in FIG. 3a, along with the equivalent model of the resulting transformer, having a primary winding with an inductance $L_p$ and a secondary winding with an inductance $L_s$. The coupling between the windings is shown by the coupling factor $k_m$. By coupling many bond wires in parallel, the currents are distributed uniformly and the resistive losses are greatly reduced. The overall coupling factor $k_m$ is increased and the inductance $L_p$, $L_s$ of each winding reduced.

Figure 3B:
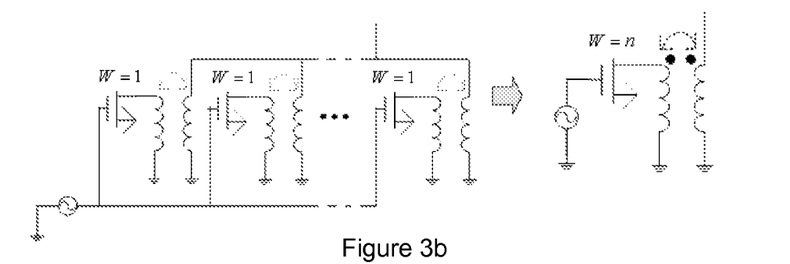

In FIG. 3b, a second way of connecting the bond wires 1 in parallel is shown along with the equivalent circuit. In this way, one end of each bond wire is connected to a ground terminal (which can be an AC- or DC-ground) and the other is connected to a respective transistor. If the transistors are identical and fed with the same signal then the same signal will be present in the bond wires 1. It is equivalent to physically connecting them in parallel.

The number of parallel bond wires is arbitrary, but the preference is for a number close to the maximum number of possible structures for a given application. For example, if transistor dies are connected to one of the transformer terminals, then the maximum number of bond wire pairs is determined by the number of transistor die bond pads available (spaced by the same pitch as the primary bond wires 1). If transmission line-like metal structures are used, then this maximum number will be determined by the transmission line's physical width. The number of parallel bond wires as well as their shape will determine the overall self inductance of each winding of the transformer, and those values can be designed according to the application needs.

An example of how the parallel bond wire transformer may be set out for use with large transistor dies (as in high RF power transistors) is as follows. If the minimum bond wire pitch is 150 µm (determined by the bonding machines) then the minimum pitch for each winding of the transformer is 300 µm. Assuming the use of a transistor die with 2.4 mm of drain bond pads (continuous or not), the primary winding can contain a maximum of 2.4 mm/300 µm=8 parallel bond wire pairs. The secondary winding can have a number close to 8 parallel bondwire sets (for example, 7 or 9), where each of the bond wire pairs would go in parallel planes spaced 150 µm from the primary bond wire planes.

The bond wire transformers described above enable the implementation of high-frequency, high-quality and high-power lumped transformers. The quality of these transformers is much greater (for example, quality factors in excess of 100 at 2.14 GHz) than the quality of standard integrated planar transformers (which typically have quality factors in the order of 10-15 at the same frequency range) or dedicated IPD transformers (with typical quality factors in the order of 25). Also, the bond wire transformer is a low cost solution which is compatible with standard manufacturing of current RF systems.

One particularly useful application of the bond wire transformer described above is in outphasing amplifiers. An outphasing amplifier produces an amplitude modulated signal by combining the outputs of two power amplifiers driven with signals of different time-varying phases. The phase modulation causes the instantaneous vector sum of the two power amplifier outputs to follow the desired input signal amplitude, allowing amplitude and phase information to be amplified. The outputs of such power amplifiers are equal in amplitude (i.e., constant envelope), and hence high efficiency amplifiers can be employed. This eliminates the linearity requirements of the branch amplifiers, which can operate in a high-efficiency mode (e.g., in a non-linear power amplifier class, such as a switch-mode class).

A key innovation in outphasing amplifiers was to realize that time-varying loads were seen by the individual amplifiers instead of a constant load. Each of the equivalent power amplifier loads was a function of the outphasing angle (which is a function of the time-varying input signal). This time-dependency in the power amplifier loads results in a reduction of the "power factor" (or, equivalently, the "instantaneous drain/collector efficiency") as the output power is reduced. This effect could be represented electrically by shunt reactive lumped elements in front of each power amplifier: an inductive element for one of the power amplifiers and a capacitive element for the other. It is possible to compensate for this undesired effect by placing opposite susceptances in shunt with the output of each amplifier branch. Those compensating susceptances are the so-called Chireix compensating elements. Ideally, this compensation can effectively maintain each-branch-PA efficiency high for as much as 10 dB below peak power, approximately, which is still reasonably good for the modern communication standards.

Most modern implementations of outphasing amplifier employ quarter wavelength transmission lines for the implementation of the output combiner. This limits the frequency performance of an outphasing amplifier. By employing the bond wire transformer presented above, the lack of high-frequency, high-power and high-efficiency transformers is overcome. Thus, high-power broadband outphasing amplifiers can now be implemented using these transformers.

Figure 4:
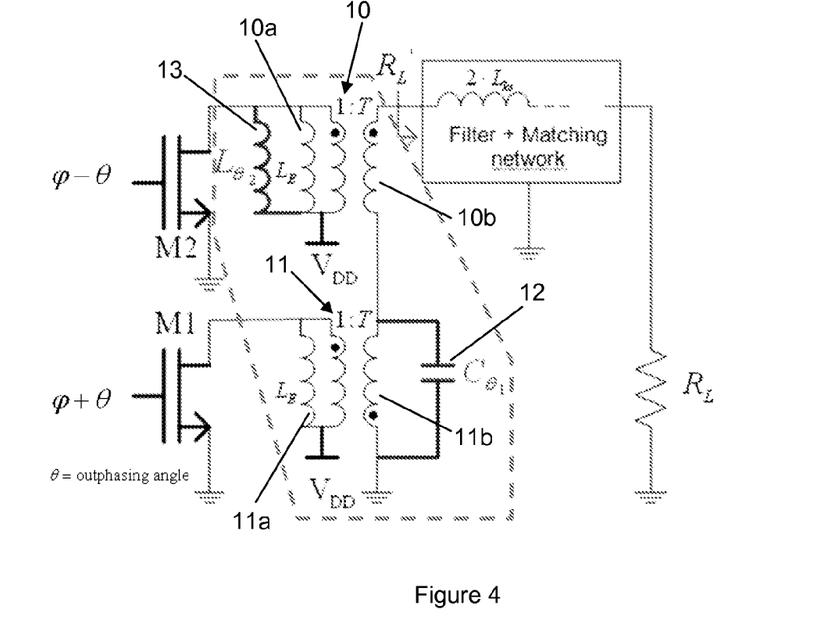
FIG. 4 shows a circuit diagram of part of an outphasing amplifier system using a transformer-based combiner according to the invention.
Figure 5:
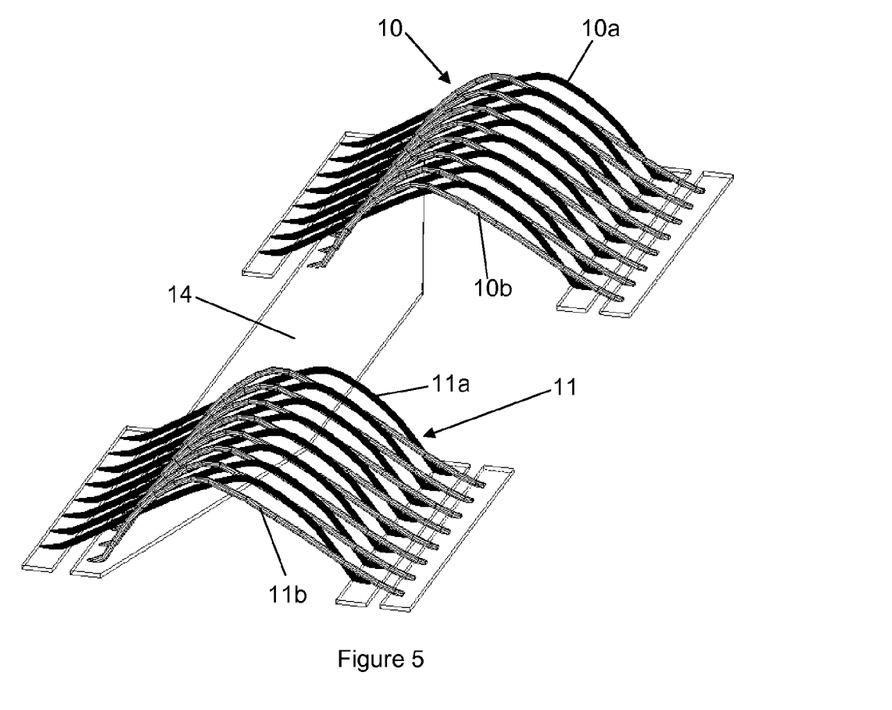
FIG. 5 shows how the transformer-based combiner and the so-called Chireix compensation elements (a compensating capacitor and a compensating inductor) may be integrated altogether.

Such an outphasing amplifier can be implemented as shown in FIGS. 4 and 5 using the bond wire transformers discussed above. Two transformers 10, 11 of the type shown in FIG. 1 implement the core of the output combiner. The magnetizing inductance of the transformers 10, 11 is initially designed such as to implement the DC-feed inductance of the power amplifiers. Thus, the two primary windings 10a, 11a of the transformers 10, 11 provide a DC path to couple the supply voltage $V_{DD}$ to each of the two amplifiers M1, M2. The power amplifiers M1, M2 are Class-E power amplifiers. For Class-E power amplifiers, the use of finite DC-feed inductances (provided by the primary windings 10a, 11a) to the power amplifiers M1, M2 has advantages in terms of output power, maximum frequency of operation and results in a higher load resistance than the classical RF-choke class-E power amplifier configuration.

In the outphasing system of FIGS. 4 and 5, the compensating elements referred to above can be placed at either the primary or secondary side of each transformer 10, 11. In FIG. 4, it can be observed that the capacitive compensating element 12 is placed at the secondary side of the transformer 11, while the inductive element 13 is placed at the primary side of transformer 10. By doing this, both compensating elements 12, 13 can be absorbed by the bond wire transformer-based combiner implementation. This is shown in FIG. 5. In this, the transformer windings 10a, 10b, 11a and 11b are clearly visible as parallel bond wires, as in FIG. 1. Transformer 10 is finally designed to have a magnetizing inductance equal to the parallel combination of the DC-feed inductance ($L_E$) and the compensating inductance 13 ($L_{\theta 2}$). In practice, this represents a small variation in shape of transformer 10 with respect to the other transformer 11. The capacitive compensating element 12 can be implemented by the parasitic capacitance to ground of the metal track 14 that connects both transformers 10 and 11. The parasitic inductive elements of the transformers 10, 11 (i.e., the leakage inductances) and the metal track 14 are absorbed into the output matching network.

The outphasing system described here is power scalable due to the bond wire transformer concept. Since the high-power RF transistors used in an outphasing amplifier are manufactured as folded transistors, the number of transistors (and bond pads) increases linearly with the rating power of the transistor. The magnetizing inductance of the bond wire transformer reduces with an increased number of parallel bond wire sets (whose number is proportional to the bond pads available, and hence it is proportional to the power rating of the transistors). To maintain a given Class-E operation, if the transistor's output parasitic capacitance increases for higher power systems, then the DC-feed inductance must reduce proportionately.

An important advantage of the outphasing system of FIGS. 4 and 5 is that the transformers 10 and 11 do not require a unitary transformer ratio (i.e., compensating the non-unitary coupling factor with the primary to secondary inductance ratio is not required). The higher the magnetic coupling factor, the more broadband the performance of the combiner will be. Additionally, by controlling the duty-cycle of the driving signal of the output stage (by any means) the performance of the outphasing system can be enhanced at several frequencies (i.e., the outphasing performance can be optimized as a function of frequency band) and at the specific operating frequency (i.e., by fine tuning of the performance due to possible manufacturing deviations of the bond wire transformer combiner).

Figure 6:
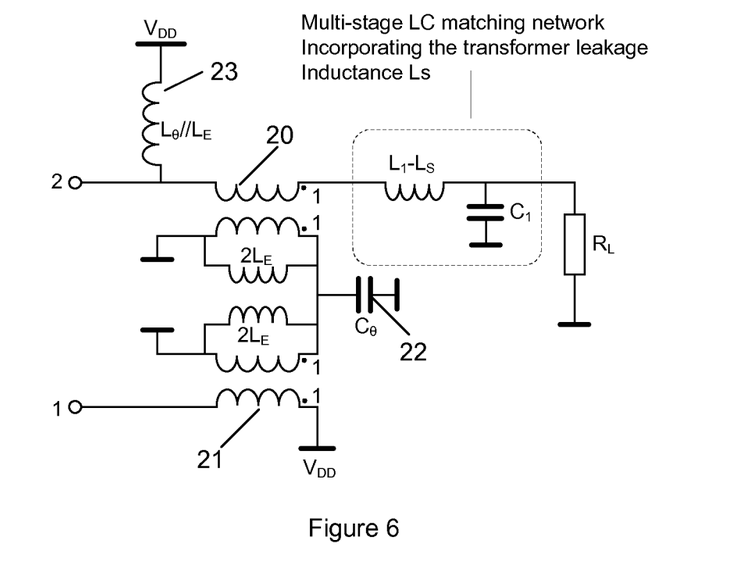
FIG. 6 shows a circuit diagram of part of another outphasing amplifier system using a transformer according to the invention.

Another version of outphasing system is shown in FIG. 6. The class-E inductance $L_E$ in the first branch is set by the magnetizing inductances of both transformers 20, 21 in parallel. The capacitive compensating element 22 ($C_\theta$) for the first branch is set by the capacitance that is provided by a track connecting the transformers 20, 21 as in the versions of FIGS. 4 and 5. The class-E DC-feed inductance ($L_E$) in the second branch is an additional inductance element. The inductive compensating element 23 ($L_\theta$) for the second branch is connected in parallel to the second $L_E$, giving a single effective inductance. The output consists of a multi-stage LC matching network that incorporates the transformers' 20, 21 leakage inductances. The additional inductance element 23 could be shifted to the output side.

The outphasing systems described above offer enhanced power efficiency with respect to state-of-the-art outphasing systems that are specially targeted for base-station applications. Also, it overcomes the problem of power scalability, enabling the design of above-100 W implementations in a reduced space. Because of the use of lumped transformer elements in its implementation, the frequency bandwidth is also increased which is useful for multi-band amplifiers. Furthermore, the magnetising inductance of the two transformers in the combiner enable a straightforward and easy way of implementing the Class-E tuning condition for both power amplifiers in the outphasing systems.

Figure 7:
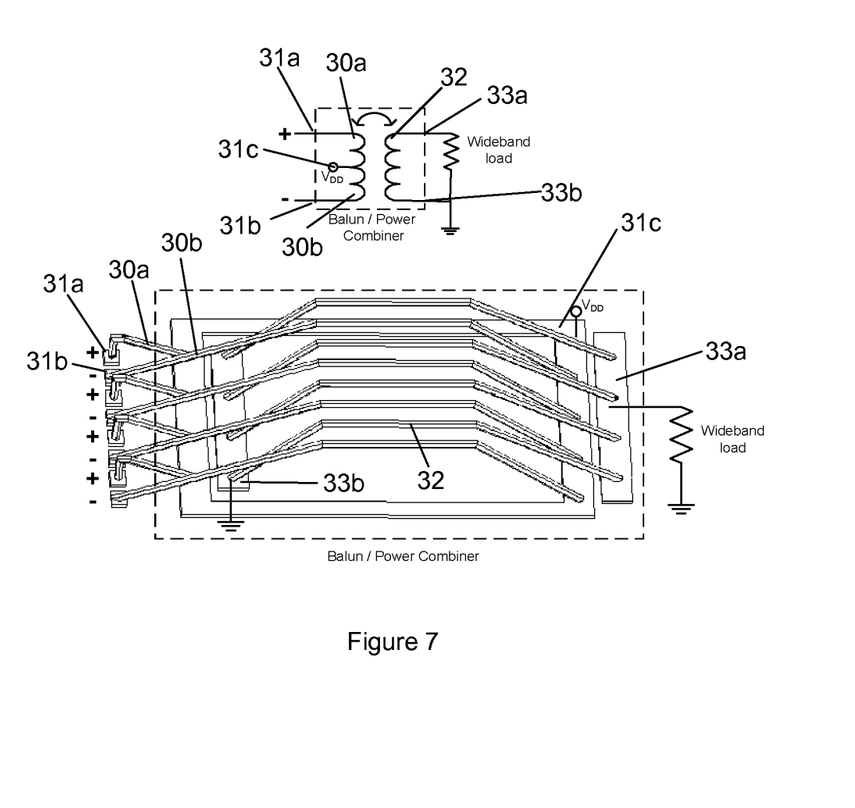
FIG. 7 shows a balun fabricated using a transformer according to the invention.

The bond wire transformers described above make use of conductive pads in the substrate on which they are built for connection of the bond wires. These pads can be arranged in different ways depending on the specific application, providing means to have the winding terminals at any side of the structure if required. As an example of how this can be employed, FIG. 7 shows a balun/power combiner which can be used for differential driven power amplifiers for wideband operation.

In this, the primary bond wires 30a, 30b are connected between a positive terminal 31a and a centre tap 31c and between a negative terminal 31b and the centre tap 31c respectively. The secondary bond wires 32 are connected between terminals 33a and 33b.

The bond wire transformer described above can be implemented using standard bond wire processes, techniques and equipment. This makes it a low cost solution, compatible with current fabrication of RF circuit and systems. Simulation results have shown that such transformers can achieve reasonably good magnetic coupling with a broad range of possible inductance values. Furthermore, a quality factor in excess of 100 at 2.14 GHz can be achieved.

In applications where power transfer is the main concern, the transformer efficiency can be defined as the ratio of the power delivered to the load to the input power. For a passive structure, this figure is always less than 1 and is ideally 1 for a lossless passive two-port structure. It has been found that transformers according to this invention can achieve a figure of around 0.97, which indicates a very good power efficiency.

Applications of the invention are (reconfigurable) transmitters for connectivity and cellular applications, where the modulation standards with high peak-to-average ration (PAR) require the power amplifier to be efficient over a large dynamic range and frequency range. These transmitters are useful for systems in which wide-band complex envelope signals are processed, such as: multi-carrier GSM/EDGE, WCDMA, HSxPA, WiMAX (OFDM) and 3G-LTE (OFDM).

Figure 8:
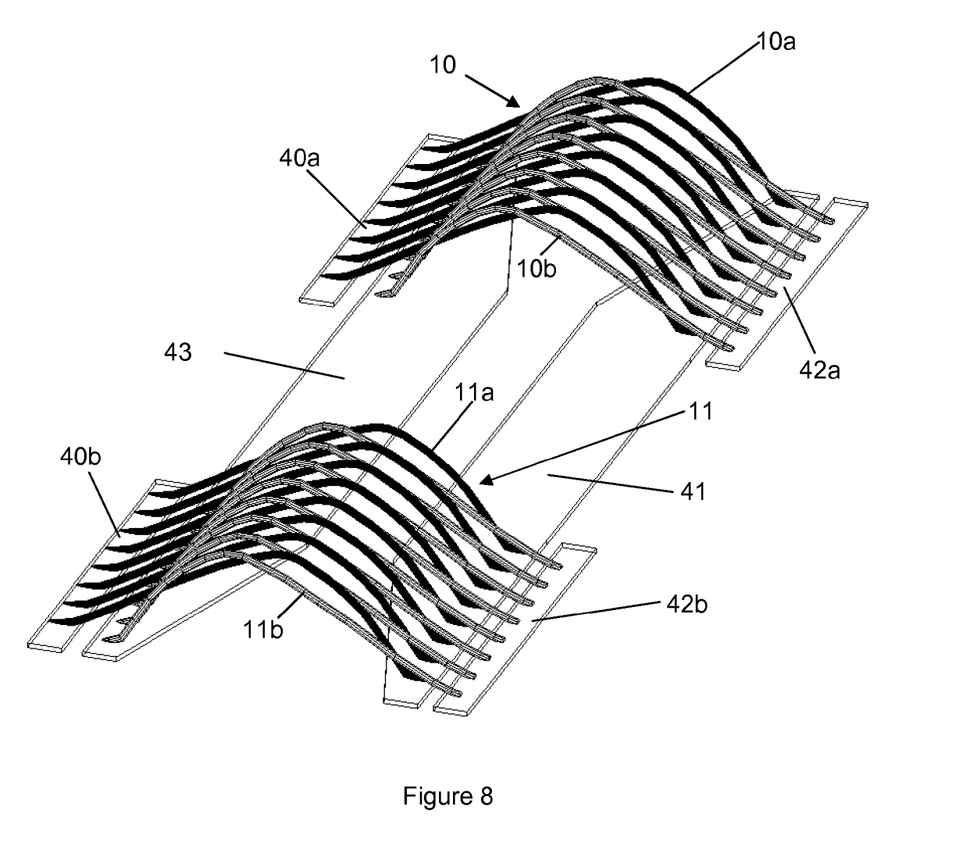
FIG. 8 shows a power combiner comprising two bond wire transformers according to the invention.

FIG. 8 shows a power combiner (both schematically and in perspective view) formed from two bond wire transformers of the type shown in FIG. 1. In this, the first transformer 10 comprises a set of primary bond wires 10a, which are connected between a first bonding pad 40a and a second bonding pad 41. The primary bond wires 11a of the second transformer 11 are connected from the second bonding pad 41 to a third bonding pad 40b. The secondary bond wires 10b of the first transformer 10 are connected between a fourth bonding pad 42a and a fifth bonding pad 43, and the secondary bond wires 11b of the second transformer 11 area connected between the fifth bonding pad 43 and a sixth bonding pad 42b.

As is shown in the perspective view, the second and fifth bonding bars 41, 43 are provided by metallic tracks to which the bond wires can be connected. This is similar to the track 14 shown in FIG. 5. The tracks 41, 43 may be designed to provide a desired capacitance to ground, although they do not necessarily need to be.

The power combiner of FIG. 8 may be used to provide the two transformers required in the outphasing amplifier system described above with reference to FIGS. 4 to 6. It may also be used more generally as a power combiner with other types of power amplifier systems (i.e. not necessarily outphasing amplifiers).

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:
1. A bond wire transformer comprising:
  a plurality of primary bond wires coupled as respective parallel circuits between first and second bonding pad inputs of the bond wire transformer, each of the primary bond wires having a first end coupled to the first bonding pad input and a second end coupled to the second bonding pad input; and a plurality of secondary bond wires coupled as respective parallel circuits between first and second bonding pad outputs of the bond wire transformer, each of the secondary bond wires having a first end coupled to the first bonding pad output, having a second end coupled to the second bonding pad output, and being spaced apart from and oriented relative to a corresponding primary bond wire for providing mutual inductance between the corresponding primary and secondary bond wires and for providing magnetic coupling between the primary and secondary bond wires.

2. A bond wire transformer according to claim 1, wherein the number of primary bond wires is the same as the number of secondary bond wires, and the plurality of primary bond wires and the plurality of secondary bond wires lie in the same plane.

3. A bond wire transformer according to claim 1, wherein the primary bond wires are connected to nodes of a circuit such that signals flowing in each of the primary bond wires are substantially the same, and the plurality of primary bond wires and the plurality of secondary bond wires have a minimum bond wire pitch of at least 150 µm.

4. A bond wire transformer according to claim 1, wherein each of the secondary bond wires is connected between third and fourth common bonding pads to form a first section of the secondary bond wire, the plurality of the primary bond wires and the plurality of the secondary bond wires are configured and arranged to form adjacent pairs, and each pair of the plurality of the secondary bond wires are in parallel planes and spaced at least 150 µm apart from each pair of the plurality of the primary bond wires.

5. A bond wire transformer according to claim 4, further comprising a fifth common bonding pad, each of the secondary bond wires extending from the fourth common bonding pad to the fifth common bonding pad to form a second section of the secondary bond wire each of the first and second sections providing mutual inductance between the corresponding primary and secondary bond wires.

6. A bond wire transformer according to claim 1, wherein the secondary bond wires are connected to nodes of a circuit such that signals flowing in each of the secondary bond wires are substantially the same.

7. An outphasing amplifier system comprising first and second power amplifiers and first and second bond wire transformers according to claim 1, each of the first and second bond wire transformers being connected to a respective one of the first and second power amplifiers such that together the first and second bond wire transformers combine the power generated by the first and second power amplifiers.

8. An outphasing amplifier system according to claim 7, wherein the secondary bond wires of the first and second bond wire transformers are coupled together by a track that is configured and arranged to have a capacitance to ground for use as a compensating element in the outphasing amplifier system.

9. An outphasing amplifier system according to claim 7, wherein the first bond wire transformer has a magnetising inductance equal to the parallel combination of a dc-feed inductance coupling a power supply to the first power amplifier and a compensating inductance.

10. An outphasing amplifier system according to claim 7, wherein the first and second bond wire transformers are identical and have their primary bond wires coupled in parallel, the primary bond wires of each bond wire transformer having a magnetising inductance equal to twice that of a DC-feed inductance required by each of the power amplifiers, the secondary bond wires of each bond wire transformer being coupled to a respective one of the first and second power amplifiers, and the outphasing system further comprises a compensating inductor coupling a power supply to the first power amplifier and having a value equal to the parallel combination of the DC-feed inductance required by the first power amplifier and an outphasing compensating inductance.

11. A balun comprising a bond wire transformer according to claim 1, wherein the primary bond wires extend from a positive terminal to a common centre tap terminal and from the centre tap terminal to a negative terminal, and the secondary bond wires extend between common first and second terminals.

12. A power combiner comprising first and second bond wire transformers according to claim 1, wherein each of the primary bond wires of the first transformer is connected between first and second bonding bars; each of the primary bond wires of the second transformer is connected between a third bonding bar and the second bonding bar; each of the secondary bond wires of the first transformer is connected between fourth and fifth bonding bars; and each of the secondary bond wires of the second transformer is connected between a sixth bonding bar and the fifth bonding bar.

13. A power combiner according to claim 12, wherein the primary and secondary bond wires of the first transformer and second transformer are connected to nodes of a circuit configured and arranged to cause signals flowing in each of the primary and secondary bond wires to be substantially the same.

14. A bond wire transformer according to claim 1, wherein the plurality of the primary bond wires and the plurality of the secondary bond wires are configured and arranged to form adjacent pairs, each pair including one of the primary bond wires and one of the plurality of secondary bond wires, wherein each adjacent pair is configured and arranged to facilitate the mutual inductance therebetween.

15. A bond wire transformer comprising:

a plurality of primary bond wires coupled as parallel circuits between first and second inputs of the bond wire transformer and each of the plurality of primary bond wires having a first end coupled to the first input, a second end coupled to the second input, and an elongated portion between a first end and a second end thereof;

a plurality of secondary bond wires coupled as parallel circuits between first and second outputs of the bond wire transformer and each of the plurality of secondary bond wires having a first end coupled to the first output, a second end coupled to the second output, and an elongated portion between a first end and a second end thereof;

and wherein, the elongated portion of each secondary bond wire is spaced apart from and oriented in a parallel direction relative to the elongated portion of a corresponding primary bond wire for providing mutual inductance between the corresponding primary and secondary bond wires and for providing magnetic coupling between the primary and secondary bond wires.

16. A bond wire transformer according to claim 15, wherein the plurality of the primary bond wires and the plurality of the secondary bond wires are configured and arranged to form adjacent pairs, each pair including one of the primary bond wires and one of the plurality of secondary bond wires, wherein each adjacent pair is configured and arranged to facilitate the mutual inductance therebetween.

17. An outphasing amplifier system comprising:
first and second power amplifiers; and
first and second bond wire transformers according to claim 15, each of the first and second bond wire transformers being connected to a respective one of the first and second power amplifiers such that together the first and second bond wire transformers combine the power generated by the first and second power amplifiers.

18. A bond wire transformer according to claim 1, wherein:
each of the primary bond wires is configured and arranged to provide a respective electrical path from the first bonding pad input to the second bonding pad input; and
each of the secondary bond wires is configured and arranged to provide a respective electrical path from the first bonding pad output to the second bonding pad output.

19. A bond wire transformer according to claim 1, wherein the primary bond wires are configured and arranged to cause, in response to a voltage difference between the first and second bonding pad inputs, each of the primary bond wires to exhibit the voltage difference between the first end of the bond wire and the second end of the bond wire.

20. A bond wire transformer according to claim 19, wherein each of the respective parallel circuits between the first and second bonding pad inputs is configured and arranged to provide a single current path between the first and second bonding pad inputs.

* * * * *